United States Patent
Xiao

(10) Patent No.: US 11,094,877 B2
(45) Date of Patent: Aug. 17, 2021

(54) METHOD FOR MAKING MRAM WITH SMALL DIMENSION AND HIGH QULITY

(71) Applicant: Rongfu Xiao, Dublin, CA (US)

(72) Inventor: Rongfu Xiao, Dublin, CA (US)

(73) Assignee: T3Memory USA, Inc., Fremont, CA (US)

( * ) Notice: Subject to any disclaimer, the term of this patent is extended or adjusted under 35 U.S.C. 154(b) by 0 days.

(21) Appl. No.: 15/081,875

(22) Filed: Mar. 26, 2016

(65) Prior Publication Data

US 2016/0211445 A1     Jul. 21, 2016

Related U.S. Application Data

(62) Division of application No. 14/562,660, filed on Dec. 5, 2014, now Pat. No. 9,437,811.

(51) Int. Cl.
     *H01L 43/12*      (2006.01)
     *H01L 43/02*      (2006.01)
     *H01L 43/08*      (2006.01)
     *H01L 43/10*      (2006.01)

(52) U.S. Cl.
     CPC .............. *H01L 43/12* (2013.01); *H01L 43/02* (2013.01); *H01L 43/08* (2013.01); *H01L 43/10* (2013.01)

(58) Field of Classification Search
None
See application file for complete search history.

(56) References Cited

U.S. PATENT DOCUMENTS

| | | | | |
|---|---|---|---|---|
| 2006/0002184 A1* | 1/2006 | Hong | ..................... | B82Y 10/00 365/171 |
| 2009/0027810 A1* | 1/2009 | Horng | .................... | B82Y 25/00 360/324.2 |
| 2011/0014500 A1* | 1/2011 | Horng | ................. | C23C 14/3414 428/846.3 |

* cited by examiner

*Primary Examiner* — Khaja Ahmad
(74) *Attorney, Agent, or Firm* — 5Suns; Yuanhui Huang

(57) ABSTRACT

This invention is about a method to make an MRAM element with small dimension, by making an MTJ as close as possible to the via, ideally aligning the MTJ and the via in a direction perpendicular to the wafer surface, for making the MRAM element dimension as small as possible. The invention provides a process scheme to flatten the interface of bottom electrode during film deposition, which ensures a good deposition of atomically smooth MTJ multilayer as close as possible to an associated via which otherwise might be atomically rough. The flattening scheme is first to deposit a thin amorphous conducting layer in the middle of BE deposition and immediately to bombard the amorphous layer by low energy ions to provide kinetic energy for surface atom diffusion to move from high point to low kinks. With such surface flattening scheme, not only the MRAM element can be made extremely small, but its device performance and magnetic stability can also be greatly improved.

19 Claims, 9 Drawing Sheets

METHOD FOR MAKING MRAM WITH SMALL DIMENSION AND HIGH QULITY

RELATED APPLICATIONS

This application is a divisional application due to a restriction requirement on application Ser. No. 14/562,660. This application seeks priority to U.S. Utility patent application Ser. No. 14/562,660 filed on Dec. 5, 2014 and the entire contents of each of which are incorporated herein by reference.

BACKGROUND OF THE INVENTION

1. Field of the Invention

This invention relates generally to a method for making magnetic random access memory (MRAM) element with small dimension and high quality for further making a complete high density and high yield MRAM.

2. Description of the Related Art

In recent years, MRAMs using the magnetoresistive effect of a ferromagnetic tunnel junctions or a magnetic tunnel junctions (MTJ) have been drawing increasing attention as the next-generation solid-state nonvolatile memories that can also cope with high-speed reading and writing. A ferromagnetic tunnel junction has a three-layer stack structure formed by stacking a recording layer having a changeable magnetization direction, an insulating tunnel barrier layer, and a fixed layer that is located on the opposite side from the recording layer and maintains a predetermined magnetization direction. Corresponding to the parallel and anti-parallel magnetic states between the recording layer magnetization and the reference layer magnetization, the magnetic memory element has low and high electrical resistance states, respectively. Accordingly, a detection of the resistance allows a magnetoresistive element to provide information stored in the magnetic memory device.

Typically, MRAM devices are classified by different write methods. A traditional MRAM is a magnetic field-switched MRAM utilizing electric line currents to generate magnetic fields and switch the magnetization direction of the recording layer in a magnetoresistive element at their cross-point location during the programming write. A spin-transfer torque (or STT)-MRAM has a different write method utilizing electrons'spin momentum transfer. Specifically, the angular momentum of the spin-polarized electrons is transmitted to the electrons in the magnetic material serving as the magnetic recording layer. According to this method, the magnetization direction of a recording layer is reversed by applying a spin-polarized current to the magnetoresistive element. As the volume of the magnetic layer forming the recording layer is smaller, the injected spin-polarized current to write or switch can be also smaller.

Further, as in a so-called perpendicular spin-transfer torque magnetic random access memories (pSTT-MRAM), both of the two magnetization films have easy axis of magnetization in a direction perpendicular to the film plane due to their strong magnetic crystalline anisotropy (shape anisotropies are not used), and accordingly, the device shape can be made smaller than that of an in-plane magnetization type.

To record information or change resistance state, typically a recording current is provided by an associated circuitry to flow in the stacked direction of the magnetoresistive element, which is hereinafter referred to as a "vertical spin-transfer method." Generally, constant-voltage recording is performed when recording is performed in a memory device accompanied by a resistance change. In a pSTT-MRAM, the majority of the applied voltage is acting on a thin oxide layer (tunnel barrier layer) which is about 10 angstroms thick, and if an excessive voltage is applied, the tunnel barrier breaks down. Even at a normal voltage operation, the tunnel barrier still could be broken if the tunnel layer is atomically rough from some points where the barrier gets thinner. More, even when the tunnel barrier does not immediately break down, if recording operations are repeated, the element may still become nonfunctional such that the resistance value changes (decreases) and information readout errors increase, making the element un-recordable. Furthermore, recording is not performed unless a sufficient voltage or sufficient spin current is applied. Accordingly, problems with insufficient recording arise before possible tunnel barrier breaks down.

In the mean time, since the switching current requirements reduce with decreasing MTJ element dimensions, pSTT-MRAM has the potential to scale nicely at the most advanced technology nodes. To make MRAM cells (FIG. 1) with small dimension, a better way is to build an MTJ element (130) directly on a via (100), connecting an associated circuitry in a semiconductor wafer, in between a bottom electrode (120) and a top electrode (140). However, due to the presence of an electrical conducting material such as Cu, the top surface of the via is usually atomically rough, which, in return, will result in a rough MgO barrier (135) and a bad magnetic tunneling. To avoid this morphological defect due to rough via, people usually build the MTJ cell away from the underneath via (FIG. 2). Unfortunately, such memory architecture will increase the dimension of the MRAM cell tremendously and make it impossible to increase memory density.

BRIEF SUMMARY OF THE PRESENT INVENTION

Present invention is about a method to make magnetic random access memory (MRAM) element with small dimension, by making a magnetic tunneling junction (MTJ) as close as possible to an associated via, ideally aligning the MTJ and the via in a direction perpendicular to the wafer surface, for making the MRAM element dimension as small as possible. The invention provides a process scheme to flatten the interface of bottom electrode during film deposition, which ensures a good deposition of atomically smooth MTJ multilayer above the via which otherwise might be atomically rough. The flattening scheme is first to deposit a thin amorphous conducting layer in the middle of BE deposition and immediately to bombard the amorphous layer by low energy ions to provide kinetic energy for atom surface diffusion to move from high point to low kinks. With such interface flattening scheme, not only the MRAM device can be made extremely small, but its device performance and magnetic stability can also be greatly improved.

Two process approaches are used, with each one has its own advantages. In the first approach, BE and MTJ film stack are deposited in one vacuum pump down and device patterning is reversed with MTJ first and BE second. This way, the deposition is more clean (because no vacuum breakdown between BE and MTJ deposition) and faster. The second approach is to deposit and pattern BE first and followed by MTJ deposition and patterning. This way, BE process can be independently tuned. In particular, a chemical mechanical polishing (CMP) can be added to further flatten the BE surface before MTJ deposition.

BRIEF DESCRIPTION OF THE DRAWINGS

FIG. 5E Top electrode layer is formed on the patterned MTJ.

DETAILED DESCRIPTION OF THE INVENTION

Figure 1:
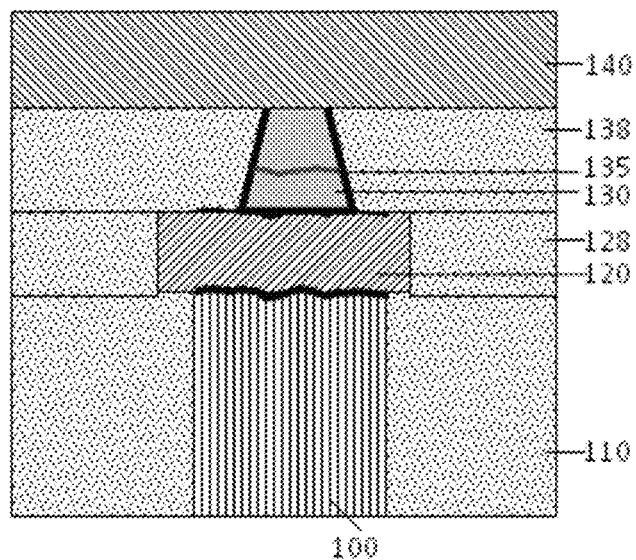
FIG. 1 An MRAM element with MTJ junction directly grown on a rough via.
Figure 2:
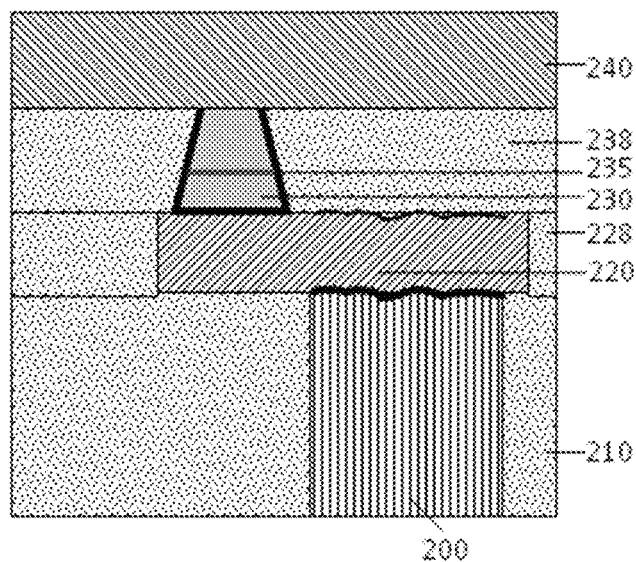
FIG. 2 An MRAM element with MTJ junction grown away from a rough via.
Figure 3:
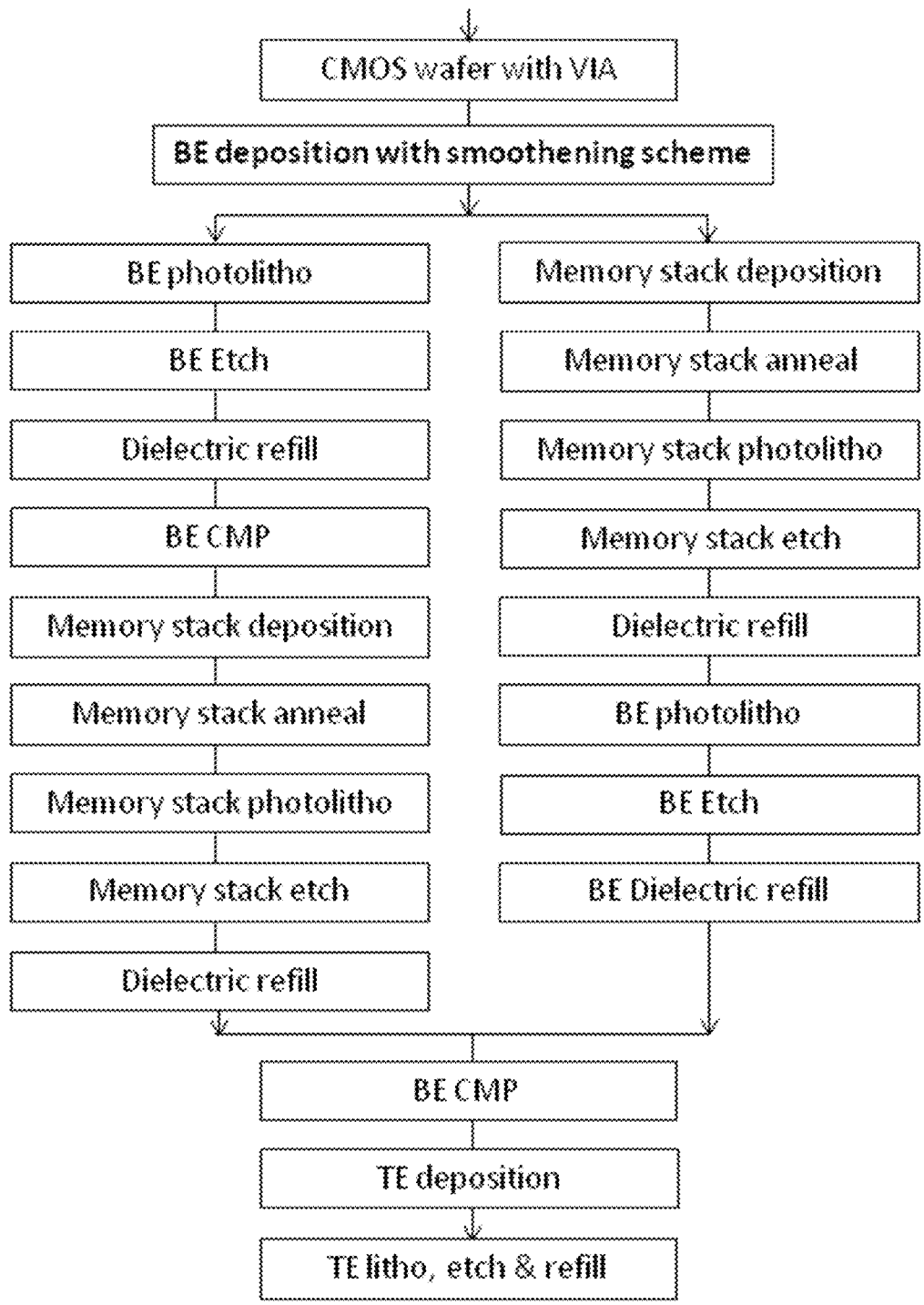
FIG. 3 Process flow: (1) MTJ photo patterning and etch first, BE second; and (2) BE photo patterning and etch first, MTJ second.

The process flow is outlined in FIG. 3. There are two different approaches to make MRAM cells. The exemplary embodiment will be described hereinafter with reference to the companying drawings. The drawings are schematic or conceptual, and the relationships between the thickness and width of portions, the proportional coefficients of sizes among portions, etc., are not necessarily the same as the actual values thereof.

Figure 4A:
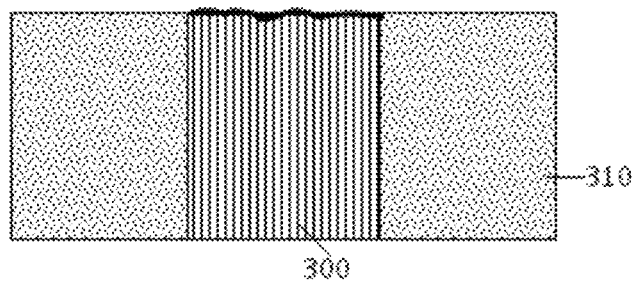
FIG. 4A Device substrate with a rough surface on the via.

The incoming wafer (FIG. 4A) has the MRAM read/write/control circuitry (not shown here) already built in with its via(s) ready for film deposition (FIG. 4A). Although the surrounding dielectric material (310) may be still smooth, the electrical conductor such as Cu material (300) in the via usually exhibits a rough surface.

The film deposition begins (FIG. 4B) with BE seed layer, such as Ta or TaN (not shown in the Figure) followed by a portion (50-100 A) of the main conducting layer, such as Ru, Cu or CuN (320) and a thin layer (10-20 A) of surface smoothening material (322), which is an amorphous layer of either Ta, Zr, or CoFeB to break up the grain growth of the main conducting material and thus smoothen the film surface for subsequent film deposition. To further smoothen the film surface, low energy ion bombardment or sputtering is used to excite atoms to move on the surface to fill surface kinks. It is preferred that the bombarding ions impinge possess a large (glazing) angle with the surface to better move the atoms from high protrusion to low valley. Then deposition of the main conducting layer, Ru, Cu or CuN is continued. To enhance the surface smoothening effect, above deposition and ion bombardment can be repeatedly used. Finally, a BE capping layer or BE etching stop layer Ta or TaN is deposited. Further processes are described in the following Embodiment One or Two depending on which approach is used. The first approach is to deposit all thin film layers for both bottom electrode (BE) and magnetic tunneling junction (MTJ) in one vacuum pump down, do MTJ photolithography patterning first and BE second. The second approach is to build the entire BE (deposition and patterning) first and MTJ second, with details to be described in Embodiment One and Two respectively.

Embodiment One

Following from the above BE deposition process, MTJ film deposition is continued without vacuum break. The deposition of MTJ film stack begin with seed layer, magnetic reference layer, magnetic tunneling oxide barrier layer, memory recording layer, capping layer and finally a hard mask layer. For pSTT-MRAM, the magnetic reference layer which is made of TbCoFe, CoX, CoX, CoX, or super lattice of [Co/X]n with X being Pt, Pd or Ni and n ranges from 5 to 20, has its uni-axial magnetic anisotropy in a direction perpendicular to a film surfaces with large coercivity (invariable). To further enhance its magnetic polarization invariability, the magnetic reference layer can be made as Y/Ru/CoFe, Y/Ru/CoFe/CoFeB with Y being TbCoFe or CoX and Ru with a thickness at its second (7-9 A) or first (3-4.5 A) oscillation peak. For in-plane STT-MRAM, the magnetic reference layer has tri-layer structure, either MnZ/Ru/CoFe or MnZ/Ru/CoFe/CoFeB with Z being either Pt, Pd or Ir. The tunnel oxide barrier layer is made of a thin metal oxide, such as MgO, ZnO or MgZnO, with a thickness between 8 and 11 A. The memory recording layer is CoFeB, CoFe/CoFeB, or CoFe/CoFeB/CoFe with a variable magnetic polarization either parallel or perpendicular to the surface. The capping layer is Ti, Mg, Ru or their oxide TiO, MgO, RuO. The hard mask layer is Ta or TaN or bi-layer of Ta/SiO2, Ta/SiN or TaN/SiO2, TaN/SiN.

After film deposition, anneal is performed either in the presence of a magnetic field or without a field (for pSTT-MRAM), at a temperature between 250 C to 350 C and annealing time of 10 minutes to 5 hours.

After annealing, a photolithography patterning is used to define MTJ cell. Then, either a reactive ion etch (RIE) or an ion beam etch (IBE) is used to etch away the exposed areas and form an isolated MTJ cell (FIG. 4G). Then dielectric (SiO2 or SiN) refill is used to cover the etched areas and an optional chemical mechanical polishing (CMP) are used to flatten the top surface (FIG. 4H).

Then another photolithography patterning is to define BE and form an isolated MTJ cell (FIG. 4I) using a RIE or an IBE. Then, dielectric (SiO2 or SiN or SiO2/SiN) refill is used to cover the etched areas and an optional CMP to flatten the top surface. Finally, a top electrode (TE) layer is formed by thin film deposition and patterning (FIG. 4J).

Embodiment Two

Figure 4B:
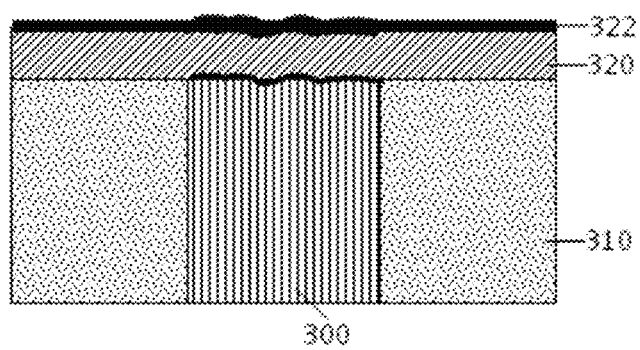
FIG. 4B A thin layer of amorphous metallic layer has been deposited on the portion of the bottom electrode.
Figure 4C:
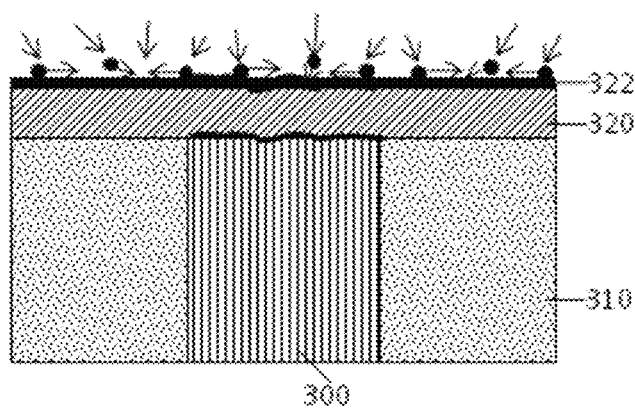
FIG. 4C A low energy ion bombardment is used to flatten the rough surface originated from the rough via.
Figure 4D:
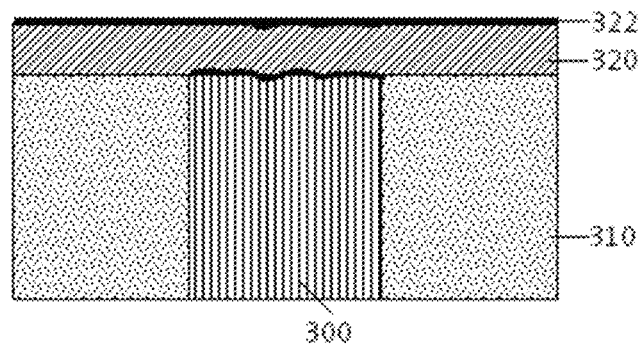
FIG. 4D A smooth BE surface has been formed by low energy bombardment.
Figure 4E:
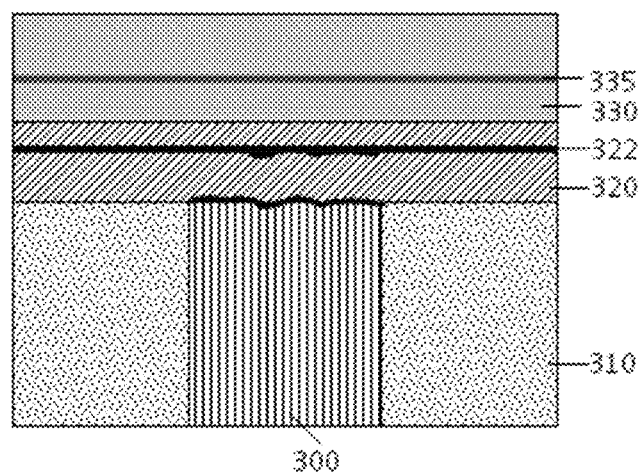
FIG. 4E A full film stack of MTJ multilayer has been deposited.
Figure 4F:
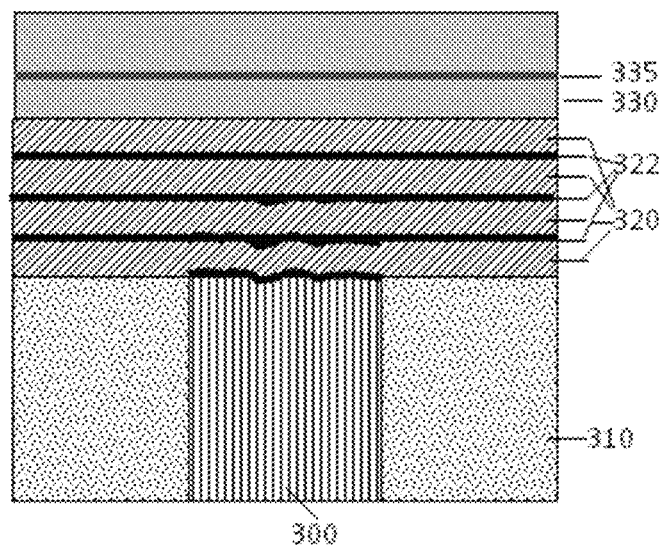
FIG. 4F Multiple layers of surface flattening layer have been added into BE layer.
Figure 4G:
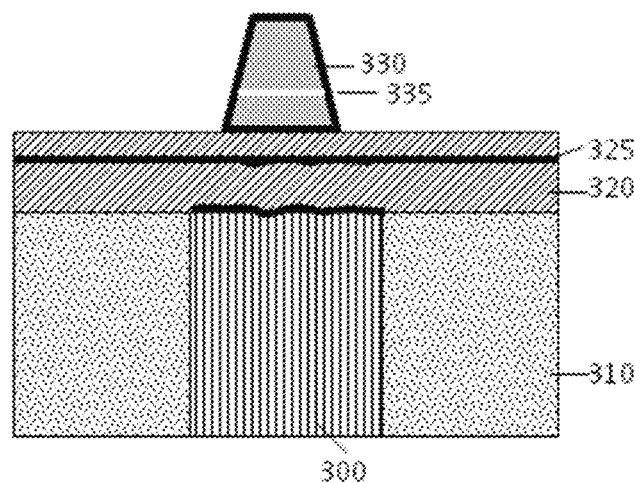
FIG. 4G A MTJ cell has been formed by photolithography patterning and etching.
Figure 4H:
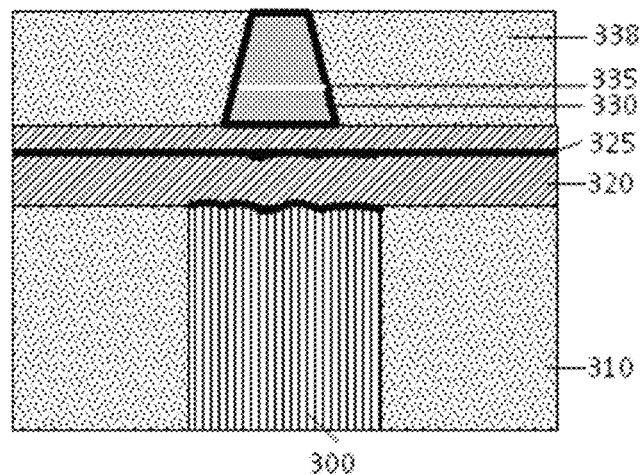
FIG. 4H Dielectric refill is added to the etched areas in the MTJ cell.
Figure 4I:
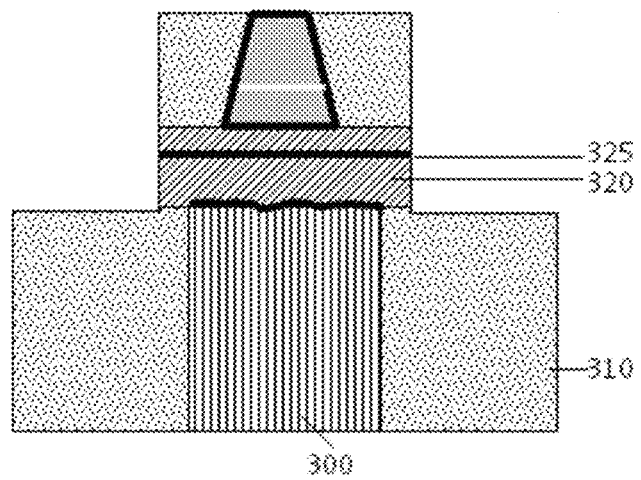
FIG. 4I BE photolithography patterning and etching are done.
Figure 4J:
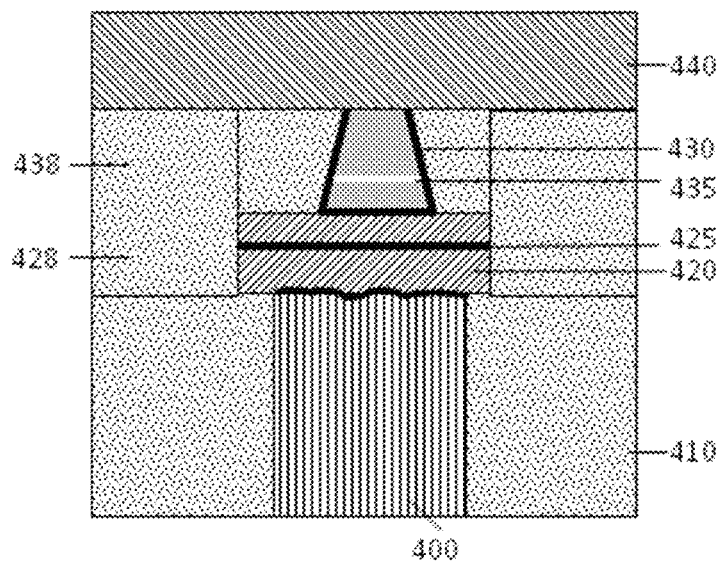
FIG. 4J Dielectric refill is added to the etched portion of BE area and top electrode layer is deposited.
Figure 5A:
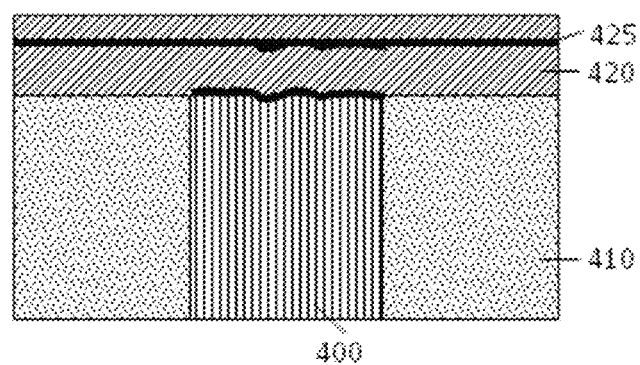
FIG. 5A A flat BE is formed with surface flattening layer is inserted.
Figure 5B:
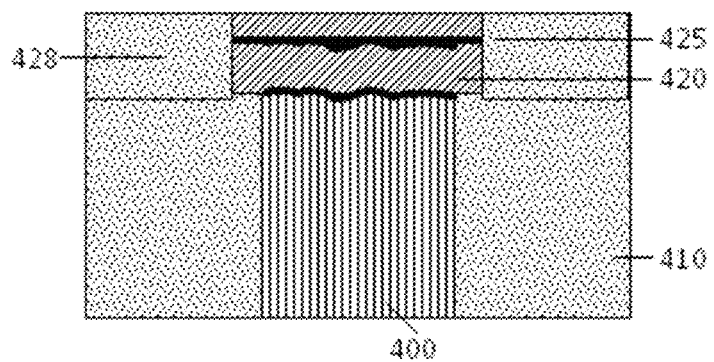
FIG. 5B BE photolithography patterning, etch and dielectric refill are done.
Figure 5C:
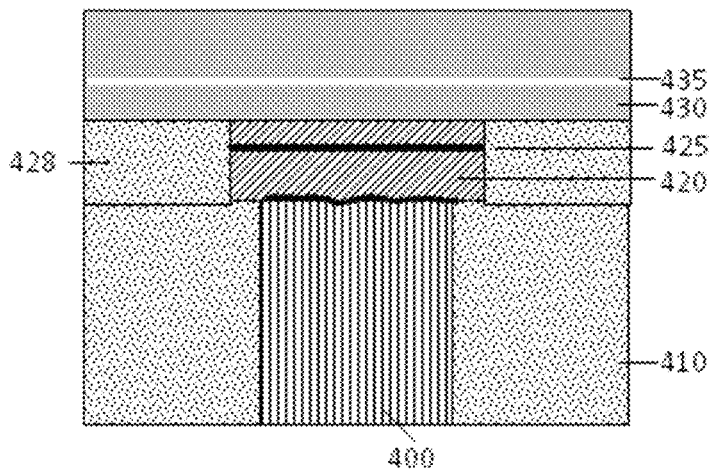
FIG. 5C MTJ multilayer is formed on the patterned BE layer.

After the BE deposition and surface smoothening processes described in the paragraph above that descibes the film deposition as illustrated in FIG. 4B, a complete BE is formed on the via (FIG. 5A). A photolithography patterning and etch are used to form an isolated BE. Then dielectric (SiO2 or SiN) refill (428) is used to cover the etched areas and an optional CMP is used to flatten the BE surface (FIG. 5B).

The wafer is moved in high vacuum physical deposition (PVD) chamber. The BE surface is sputtering cleaned, and then MTJ film stack is deposited on the patterned BE. The deposition of MTJ film stack (430) begin with seed layer, magnetic reference layer, magnetic tunneling oxide barrier layer (435), memory recording layer, capping layer and finally a hard mask layer. For pSTT-MRAM, the magnetic reference layer which is made of TbCoFe, CoX, CoX, CoX, or super lattice of [Co/X]n with X being Pt, Pd or Ni and n ranges from 5 to 30, has its uni-axial magnetic anisotropy in a direction perpendicular to a film surfaces with large coercivity (invariable). To further enhance its magnetic polarization invariability, the magnetic reference layer can be made as Y/Ru/CoFe, Y/Ru/CoFe/CoFeB with Y being TbCoFe, CoX or TbCoFe/CoFe, CoX/CoFe and Ru with a thickness at its second (7-9 A) or first (3-4.5 A) oscillation peak. For in-plane STT-MRAM, the magnetic reference layer has tri-layer structure, either MnZ/Ru/CoFe or MnZ/Ru/CoFe/CoFeB with Z being either Pt, Pd or Ir. The tunnel oxide barrier layer is made of a thin metal oxide, such as MgO, ZnO or MgZnO, with a thickness between 8 and 11 A. The memory recording layer is CoFeB, CoFe/CoFeB, or CoFe/CoFeB/CoFe with a variable magnetic polarization either parallel or perpendicular to the surface. The capping layer is Ti, Mg, Ru or their oxide TiO, MgO, RuO. The hard mask layer is Ta or TaN or bi-layer of Ta/SiO2, Ta/SiN or TaN/SiO2, TaN/SiN.

After film deposition, anneal is performed either in the presence of a magnetic field or without a field (for pSTT-MRAM), at a temperature between 250 C to 350 C and annealing time of 10 minutes to 5 hours.

Figure 5D:
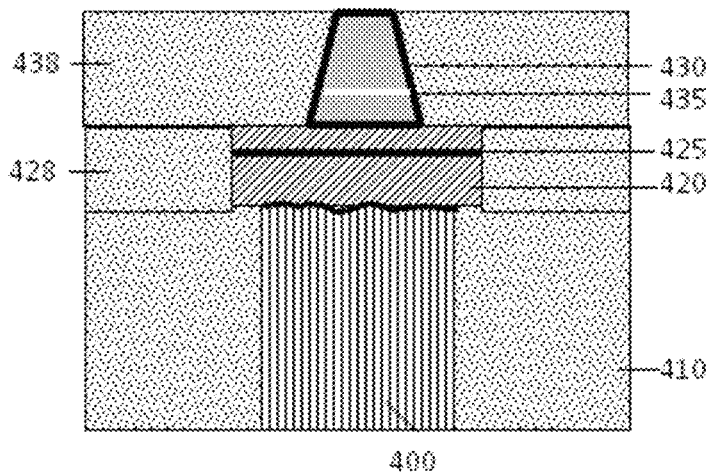
FIG. 5D Photolithography patterning, MTJ etch and refill are done.
Figure 5E:
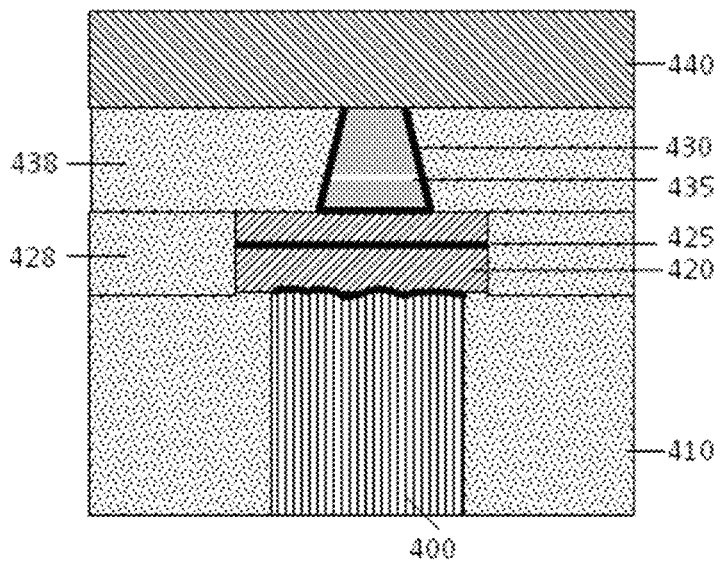

After annealing, photolithography patterning is used to define MTJ cell. Then, either a reactive ion etch (RIE) or an ion beam etch (IBE) is used to etch away the exposed areas and form an isolated MTJ cell. Then dielectric (SiO2 or SiN) refill is used to cover the etched areas and an optional chemical mechanical polishing (CMP) are used to flatten the top surface (FIG. 5D). Finally, a top electrode (TE) layer is formed by thin film deposition and patterning (FIG. 5E).

While certain embodiments have been described above, these embodiments have been presented by way of example only, and are not intended to limit the scope of the inventions. For an example, the perpendicular MTJ element in each embodiment may have reversed layer-by-layer sequence. The method described here may also work for in-plane STT-MRAM manufacturing or field-driven MRAM. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A method for making a small dimension and high quality magnetic random access memory (MRAM) element for further making a high density and high yield MRAM comprising:
   1a. making a bottom electrode (BE) layer atop a via in a semiconductor wafer in process that connects an associated read/write/control circuitry in the semiconductor wafer, wherein making the BE layer further comprising:
      1a(a). making a seed layer atop the semiconductor wafer in process;
      1a(b). making a first conducting layer atop the seed layer;
      1a(c). making an amorphous conducting layer atop the first conducting layer to break grain growth of the first conducting layer;
      1a(d). making the amorphous conducting layer flatter and smoother;
      1a(e). making a second conducting layer atop the amorphous conducting layer; and
      1a(f). repeating the sequence of 1a(c)-1a(e) with zero (0) or more time(s) until a top surface of BE in process becomes sufficiently flat and smooth; and
   1b. making a magnetic tunneling junction (MTJ) atop the BE.

2. The method of claim 1 wherein making the BE and the MTJ comprising
   2a. making the BE; and
   2b. making the MTJ.

3. The method of claim 1 wherein making the BE and the MTJ, alternatively, comprising
   3a. making the BE;
   3b. polishing the top surface of the BE with chemical mechanical polishing (CMP); and
   3c. making the MTJ.

4. The method of claim 1 wherein making the MTJ comprising
   making a seed layer atop the BE;
   making a reference layer having a magnetic anisotropy with an invariable magnetic direction atop the seed layer;
   making a tunnel barrier layer atop the recording reference layer;
   making a recording layer having a magnetic anisotropy with a variable magnetic direction atop the tunnel barrier layer; and
   making a capping layer atop the recording layer.

5. The method of claim 1 wherein making the MTJ, alternatively, comprising
   making a seed layer atop the BE;
   making a recording layer having a magnetic anisotropy with a variable magnetic direction atop the seed layer;
   making a tunnel barrier layer atop the recording layer;
   making a reference layer having a magnetic anisotropy with an invariable magnetic direction atop the tunnel barrier layer; and
   making a capping layer atop the reference layer.

6. The method of claim 4 wherein making the seed layer comprising making an electrical conducting layer with but not limited to Ta, TaN with a thickness between 20 Å and 100 Å.

7. The method of claim 5 wherein making the seed layer comprising making an electrical conducting layer with but not limited to Ta, TaN with a thickness between 20 Å and 100 Å.

8. The method of claim 4 wherein making the first and second conducting layers comprising making an electrical conducting layer with but not limited to Ru, Cu, or CuN with a thickness between 30 Å and 100 Å.

9. The method of claim 5 wherein making the first and second conducting layers comprising making an electrical conducting layer with but not limited to Ru, Cu, or CuN with a thickness between 30 Å and 100 Å.

10. The method of claim 4 wherein making the amorphous conducting layer comprising making an amorphous electrical conducting layer with but not limited to Ta, W, Zr, or NiCr, CoFeB with a thickness between 5 Å and 30 Å.

11. The method of claim 5 wherein making the amorphous conducting layer comprising making an amorphous electrical conducting layer with but not limited to Ta, W, Zr, or NiCr, CoFeB with a thickness between 5 Å and 30 Å.

12. The method of claim 4 wherein making the amorphous conducting layer(s) flatter and smoother comprises applying a low power ion sputtering process on top of the first and second conducting layers.

13. The method of claim 5 wherein making the amorphous conducting layer(s) flatter and smoother comprises applying a low power ion sputtering process on top of the first and second conducting layers.

14. The method of claim 4 wherein making the amorphous conducting layer(s) flatter and smoother comprises bombarding of the amorphous conducting layer(s) with a low energy ion beam process on the surface(s) of amorphous conducting layer.

15. The method of claim 5 wherein making the amorphous conducting layer(s) flatter and smoother comprises bombarding of the amorphous conducting layer(s) with a low energy ion beam process on the surface(s) of amorphous conducting layer(s).

16. The method of claim 14 wherein bombarding ion beam comprising an ion beam bombarding having a large (glazing) angle by moving the material from rough bump to valley.

17. The method of claim 15 wherein bombarding ion beam comprising an ion beam bombarding having a large (glazing) angle by moving the material from rough bump to valley.

18. The method of claim 2 further comprising having the MTJ and BE to be photolithography-patterned and subsequently etched such that making the MTJ as close as possible to the via, ideally aligning the MTJ and the via in a direction perpendicular to the semiconductor wafer surface, for making the MRAM element dimension as small as possible.

19. The method of claim 3 further comprising having the MTJ and BE to be photolithography-patterned and subsequently etched such that making the MTJ as close as possible to the via, ideally aligning the MTJ and the via in a direction perpendicular to the semiconductor wafer surface, for making the MRAM element dimension as small as possible.

* * * * *